United States Patent

Sengoku

[11] Patent Number: 5,396,501
[45] Date of Patent: Mar. 7, 1995

[54] TEST ACCESS PORT CONTROLLER WITH A GATE FOR CONTROLLING A SHIFT DATA REGISTER SIGNAL

[75] Inventor: Shoichiro Sengoku, Tokyo, Japan
[73] Assignee: NEC Corporation, Tokyo, Japan
[21] Appl. No.: 954,745
[22] Filed: Sep. 30, 1992
[30] Foreign Application Priority Data
  Oct. 2, 1991 [JP] Japan .................... 3-254040
[51] Int. Cl.[6] ................ H04B 17/00; G01R 31/28
[52] U.S. Cl. .................... 371/22.3; 324/158.1
[58] Field of Search ............... 371/22.3; 324/158 R

[56] References Cited
U.S. PATENT DOCUMENTS

| | | | |
|---|---|---|---|
| 4,621,364 | 11/1986 | Tschoepe | 371/38 |
| 4,651,323 | 3/1987 | Goodman et al. | 371/60 |
| 4,698,588 | 10/1987 | Hwang et al. | 324/73 R |
| 5,048,021 | 9/1991 | Jarwala | 371/22.3 |
| 5,072,450 | 12/1991 | Helm et al. | 371/21.6 |
| 5,109,190 | 4/1992 | Sakashita et al. | 324/158 R |
| 5,150,044 | 9/1992 | Hashizume et al. | 324/158 R |
| 5,155,732 | 10/1992 | Jarwala et al. | 371/22.3 |
| 5,166,604 | 11/1992 | Ahanin et al. | 324/158 R |
| 5,228,045 | 7/1993 | Chiles | 371/22.3 |
| 5,260,948 | 11/1993 | Simpson et al. | 371/22.3 |

OTHER PUBLICATIONS

IEEE Standard Test Access Port and Boundary-Scan Architecture, May 21, 1990, 3-2-3-3.

Primary Examiner—Robert W. Beausoliel, Jr.
Assistant Examiner—Phillip F. Vales
Attorney, Agent, or Firm—Whitham, Curtis, Whitham & McGinn

[57] ABSTRACT

When a test access port (TAP) controller based on the U.S. standard IEEE 1149.1 is used, a gate is provided for controlling the signal output of its shift register so as to turn high when it is in the normal condition to control the selector signal so that, during the normal operation, the input terminal is set disable at the selector circuit within the boundary scan register cell. As a result, it can be completely prevented that the penetrating current, which can be induced when the input selector signal is on the intermediate level of potential, be induced within the selector circuit or DFF circuit within the boundary scan register.

2 Claims, 7 Drawing Sheets

TEST ACCESS PORT CONTROLLER WITH A GATE FOR CONTROLLING A SHIFT DATA REGISTER SIGNAL

BACKGROUND OF THE INVENTION

The present invention relates to a TAP (Test Access Port) controller used in testing an IC chip made based on IEEE 1149.1 of the U.S. IEEE standard.

A boundary scan system defined in the IEEE standard 1149.1 for testing a digital IC chip comprises a boundary scan register provided between an internal logic circuit and an I/O terminal for entering each test signal and a TAP controller for feeding various test signals to this boundary scan register.

The TAP controller allows a test mode selector signal (TMS) and a test clock (TCK) to be entered while allowing sixteen kinds of test signals to be emitted. FIG. 1 illustrates a block diagram of a conventional TAP controller 70 which is connected to a boundary scan register cell 71 for entering the test signal. An asterisk sign (*) is attached to the end of the name of the active low signal.

From the exterior to the TAP controller 70, a test clock TCK signal 12 and a TMS signal 44 of the mode selector signal are entered, while, from the TAP controller 70 to the boundary scan register cell 71, a ShiftDR (shift data register) signal 41 and a ClockDR (clock data register) signal 42 are emitted. A further input/output signal 73 is independent of the boundary scan register 71.

FIG. 2 illustrates an internal circuit of the boundary scan register cell. An external input PI (pin-in) signal 72 is entered from an input pin to the boundary scan register cell 71, and, as the shift input of the previous stage boundary register cell (not shown), a SO (shift-out) signal 75 is emitted.

A selector circuit (MPX) 81 selects the PI signal 72, with a ShiftDR signal 41 as the selector signal, when this ShiftDR signal 41 is low, and selects an SI signal 74 when it is high. A signal 82 selected by this selector circuit 81 is entered to a DFF (D-type flip-flop) 83 to be emitted as the SO signal 75 at the rising edge of the ClockDR signal 42.

A circuit diagram of a conventional TAP controller 70 is shown in FIGS. 3 and 4 in more detail. For the purpose of illustration, the TAP controller 70 is divided into two portions 70A and 70B. The TAP controller 70 comprises DFF 4 to 7 for emitting a set rising edge, DFF 27 to 29 and 32 for emitting a reset rising edge, inverters 2, 13 and 45, NAND gates 22 to 24, 30, 33 and 46 to 66 and AND gates 31, 34, and enters a TRST* (TAP reset) signal 1, a TCK signal 12 and a TMS signal 44 while emitting a Reset signal 35, a Select signal 36, Enable signal 37, ShiftIR (Shift Instruction register) signal 38, ClockIR signal 39, UpdateIR signal 40, ShiftDR signal 41, ClockDR signal 42 and UpdateDR signal 43, respectively. NA signal 8 through ND signal 11, A to D signals 21 to 18, A* to D* signals 17 to 14 are internal signals.

As described above, the TAP controller 70 is shown divided into FIGS. 3 and 4, and the portions 8, 9, 10 and 11 in FIG. 3 are connected to 8, 9, 10 and 11 in FIG. 4, respectively, and each internal signal is connected to a corresponding one having the same name and numeral as that of FIGS. 3 and 4, and TRST*, TCK TMS signals 1, 12 and 44 are entered and the output signals 35 through 43 are each emitted as test signals.

The timing of the signals in the conventional TAP controller 70 and the boundary scan register cell 71 are shown in FIG. 5. Referring to the control timing of this TAP controller 70, since, with its normal operating condition free of the test operation (Test-Logic-Reset condition as shown in IEEE 1149.1), ShiftDR signal 41 is low, selector circuit 81 of FIG. 2 selects a PI signal 72, which, if it lies on the intermediate potential level, induces a penetrating current at the selector circuit 81 or DFF 83.

In the above-described method of controlling the conventional TAP controller 70, since, with the Test-Logic-Reset condition, ShiftDR signal 41 is low, and the selector circuit 81 selects the PI signal 72, when the PI signal 72 is on the intermediate level of potential, the penetrating current can be induced at the selector circuit 81 or DFF 83.

SUMMARY OF THE INVENTION

Accordingly, an object of the present invention is to provide a TAP controller which may prevent the penetrating current from flowing through the selector circuit or DFF even if the PI signal lies on the intermediate level.

The TAP controller according to the present invention is a TAP controller for emitting a shift data register signal for selecting the input of the boundary scan register, which is arranged based on the U.S. IEEE standard 1149.1, and which is provided with a gate for controlling the shift data register signal so that, during Test-Logic-Reset condition, the terminal input of each cell of the boundary scan register is set disable.

When the controller is in the test condition, the shift data register signal is inverted by the inverter to be NANDed with the reset signal to emit a shift register signal to the boundary scan register, or ANDs the input signal of the reset signal output circuit and the input signal of the shift data register signal output circuit as an input for the shift data register signal output circuit. As a result, while the TAP controller is reset during the normal operation, the shift data register signal output can be held to "H", so that no penetrating current is induced within the boundary scan register cell.

The present invention will be described in more detail with reference to the accompanying drawings.

DESCRIPTION OF THE PREFERRED EMBODIMENT

Figure 3:
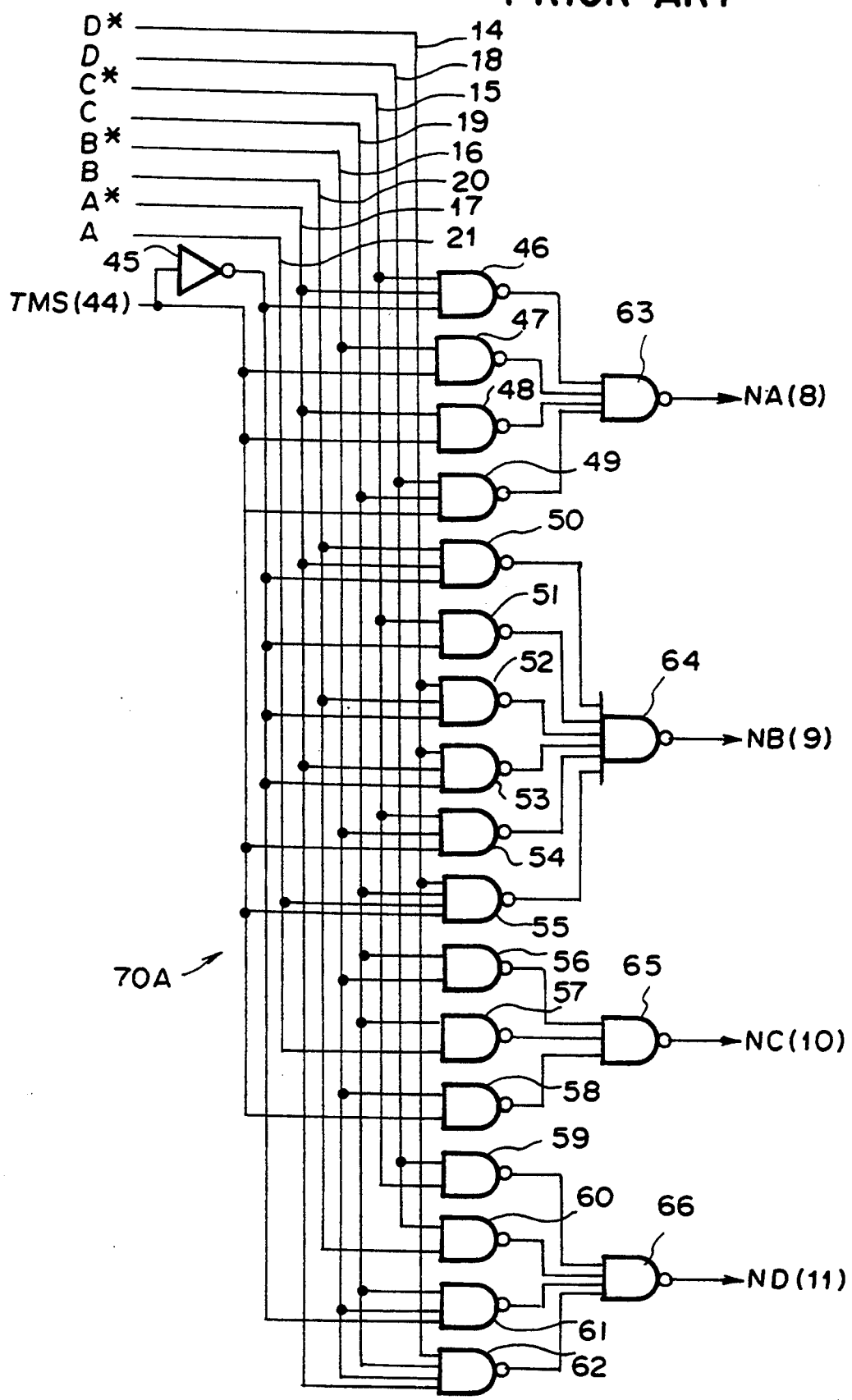
FIG. 3 is a circuit diagram of the input portion of a conventional TAP controller.
Figure 4:
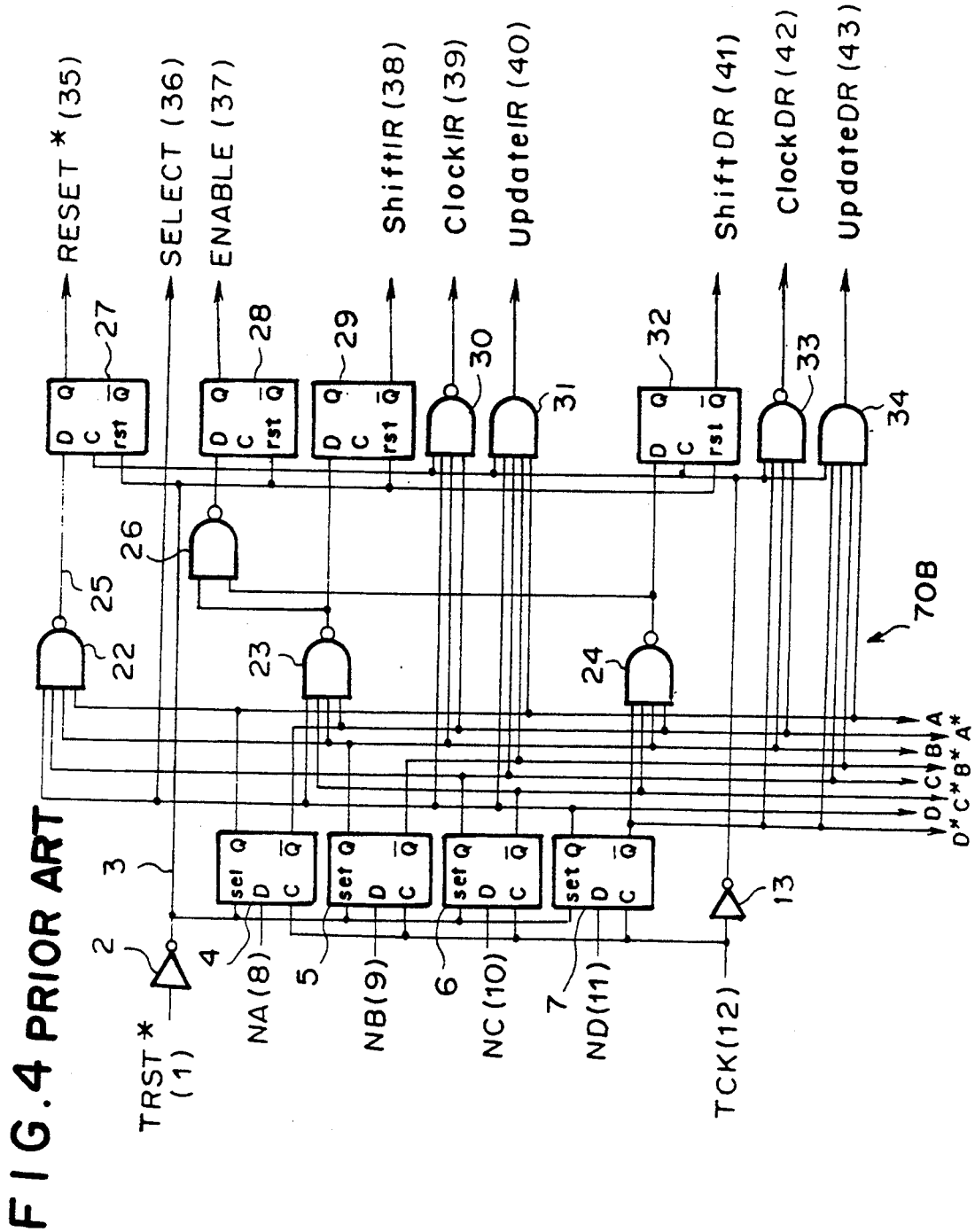
FIG. 4 is a circuit diagram of the output portion of the conventional TAP controller.
Figure 5:
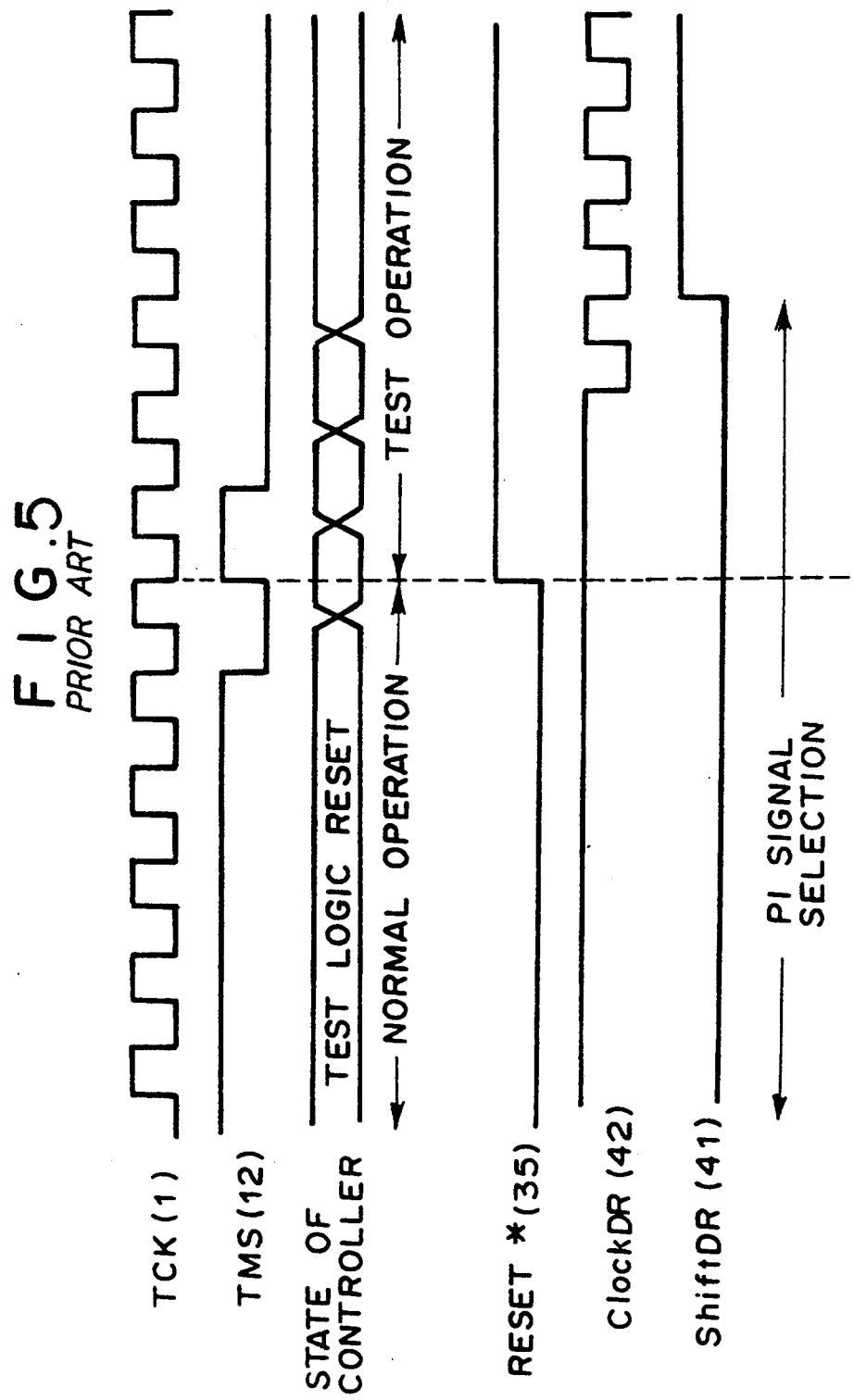
FIG. 5 is a timing chart of a various signals in the conventional/TAP controller shown in FIG. 4.
Figure 6:
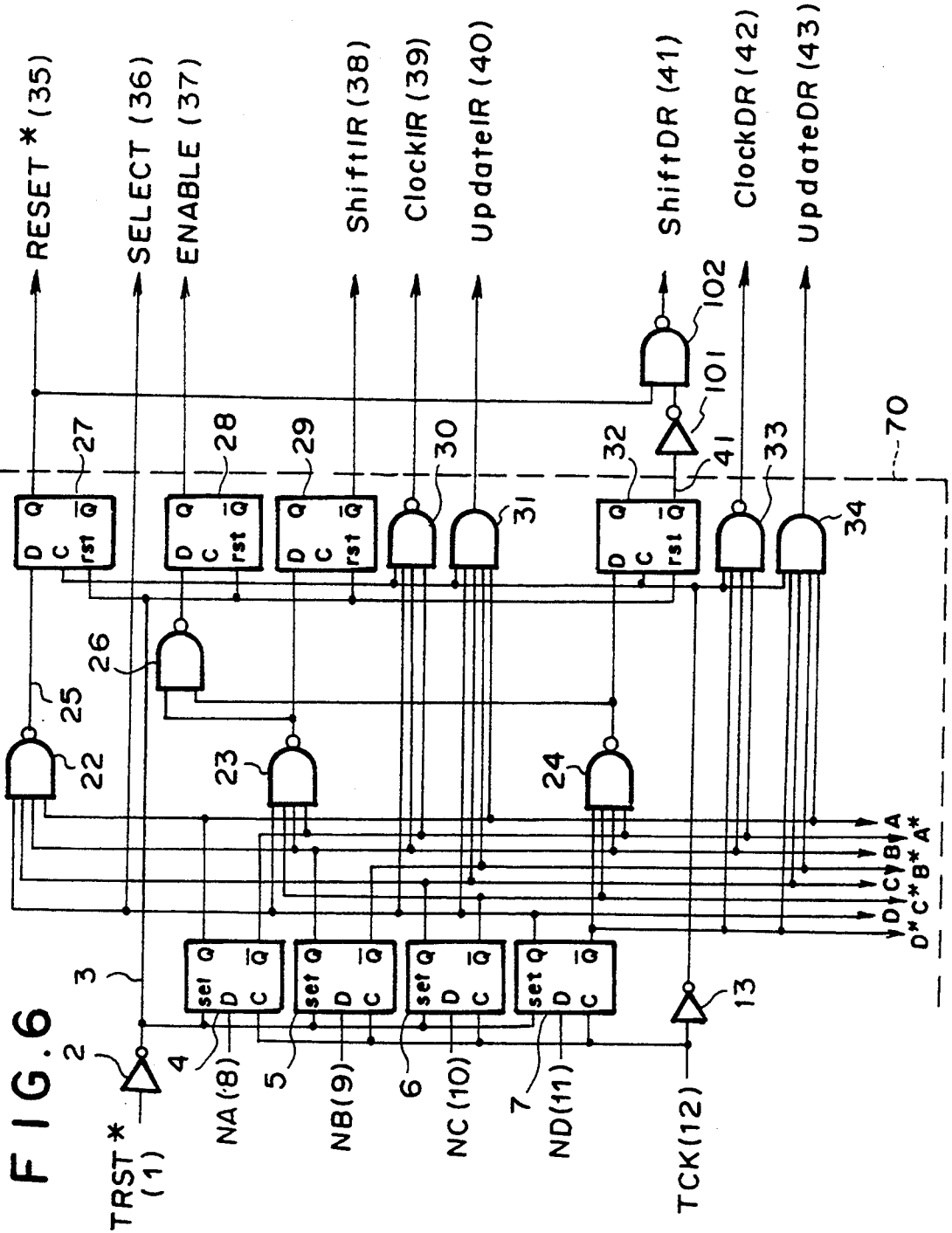
FIG. 6 is a circuit diagram of part of a TAP controller embodying the present invention.

Referring now to the drawings, more particularly to FIG. 6 which illustrates a circuit diagram of part of the first embodiment of the present invention corresponding to the portion B of the conventional TAP controller shown in FIG. 4. That is, the TAP controller of this embodiment includes inverters 101 and a NAND gate 102, and the remaining portions corresponds to the conventional TAP controller shown in FIGS. 3 and 4, a portion 70 surrounded by a dotted line corresponding to a conventional TAP controller 70B.

A Q output ShiftDR signal 41 of the conventional DFF is inverted by the inverter 101 to enter to the NAND gate 102 together with a Reset* signal 35. The output of the NAND gate 102 serves as a ShiftDR signal 41.

Figure 1:
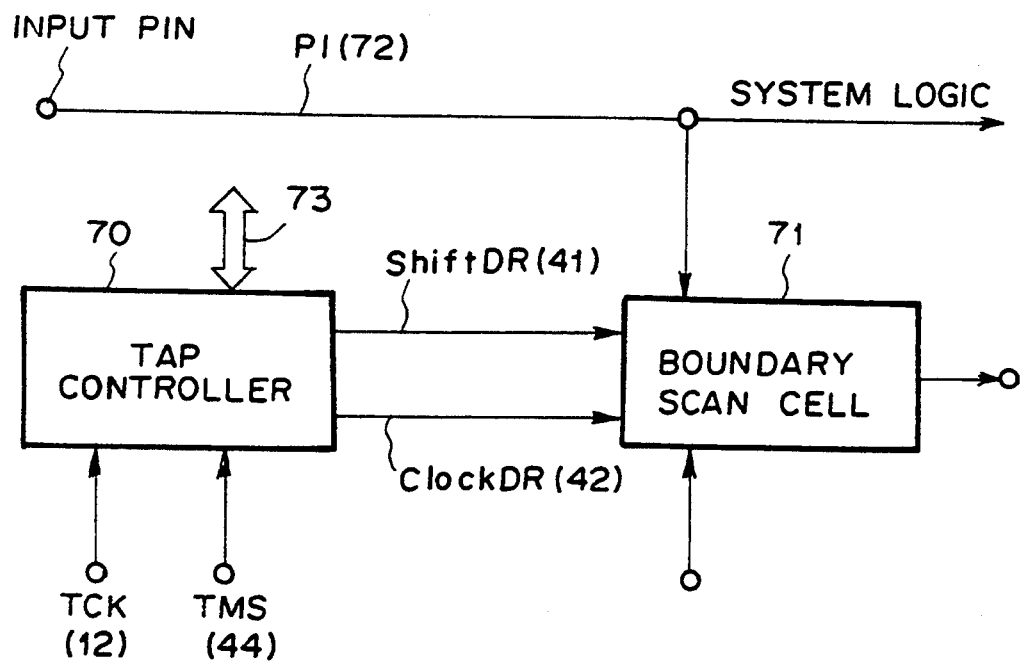
FIG. 1 is a block diagram illustrating a TAP controller and a boundary scan register cell connected thereto.
Figure 2:
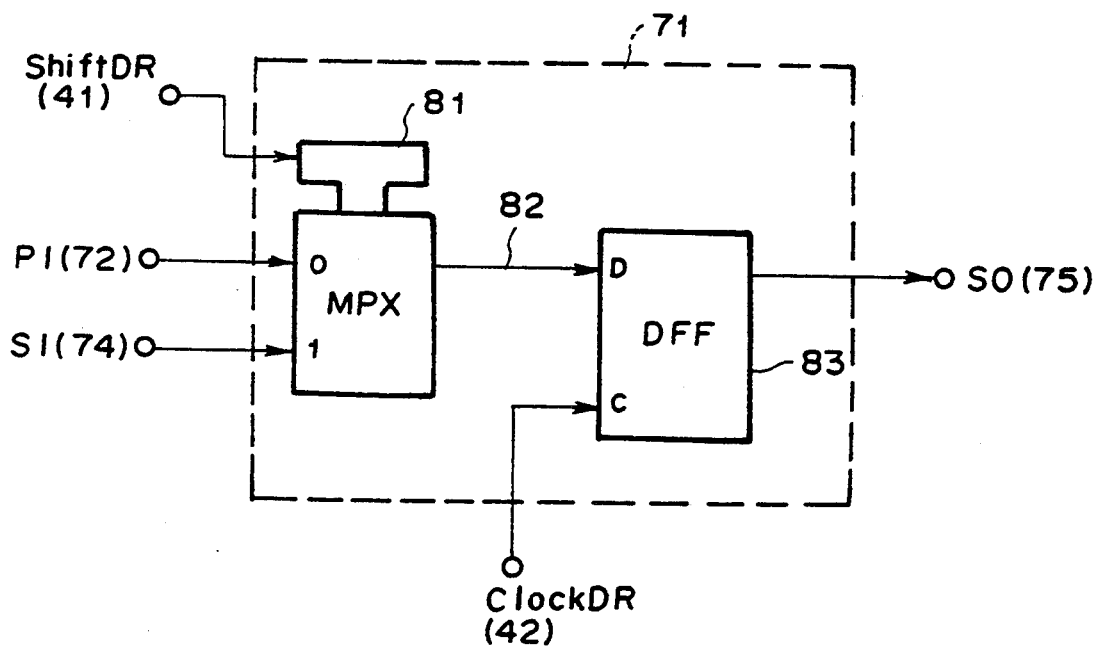
FIG. 2 is a block diagram of the boundary scan register cell shown in FIG. 1.
Figure 7:
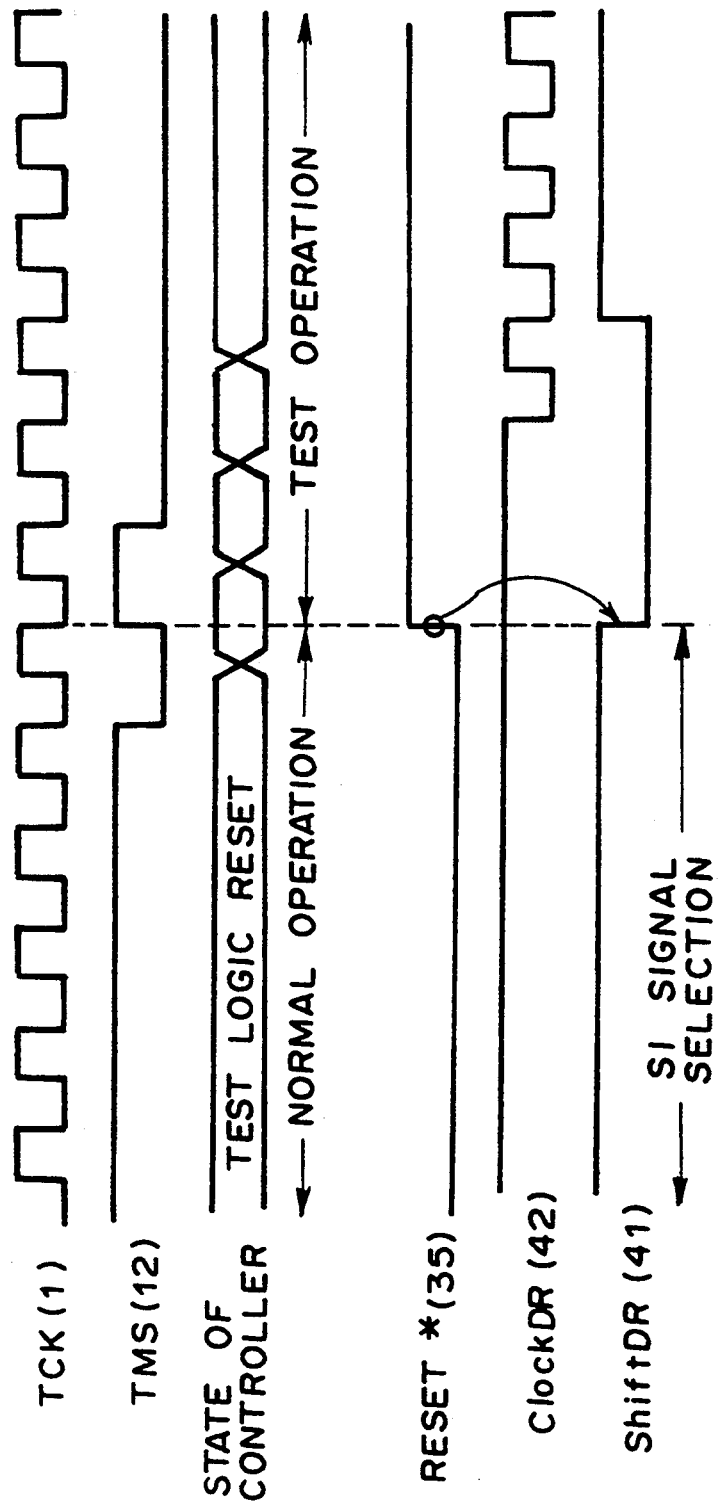
FIG. 7 is a timing chart of the various signals upon operation of the TAP controller shown in FIG. 6.

The timing for this embodiment when the TAP controller 70 and the boundary scan register cell 71 operate is shown in FIG. 7. When the TAP controller 70 is in its Test-Logic-Reset condition, that is, it is not in the testing condition, the Reset* signal 35 are held low, and the inputs of NAND 102 is "L" and "H" and the output is "H", so that ShiftDR signal 41 is held high. On the other hand, since the selector circuit 81 (FIG. 2) within the boundary scan register cell 71, while the ShiftDR signal 103 is high, selects SI signal 74, even if the PI signal 72 is turned into the intermediate level, it can be prevented the penetrating current is induced within the boundary scan register cell 71.

Figure 8:
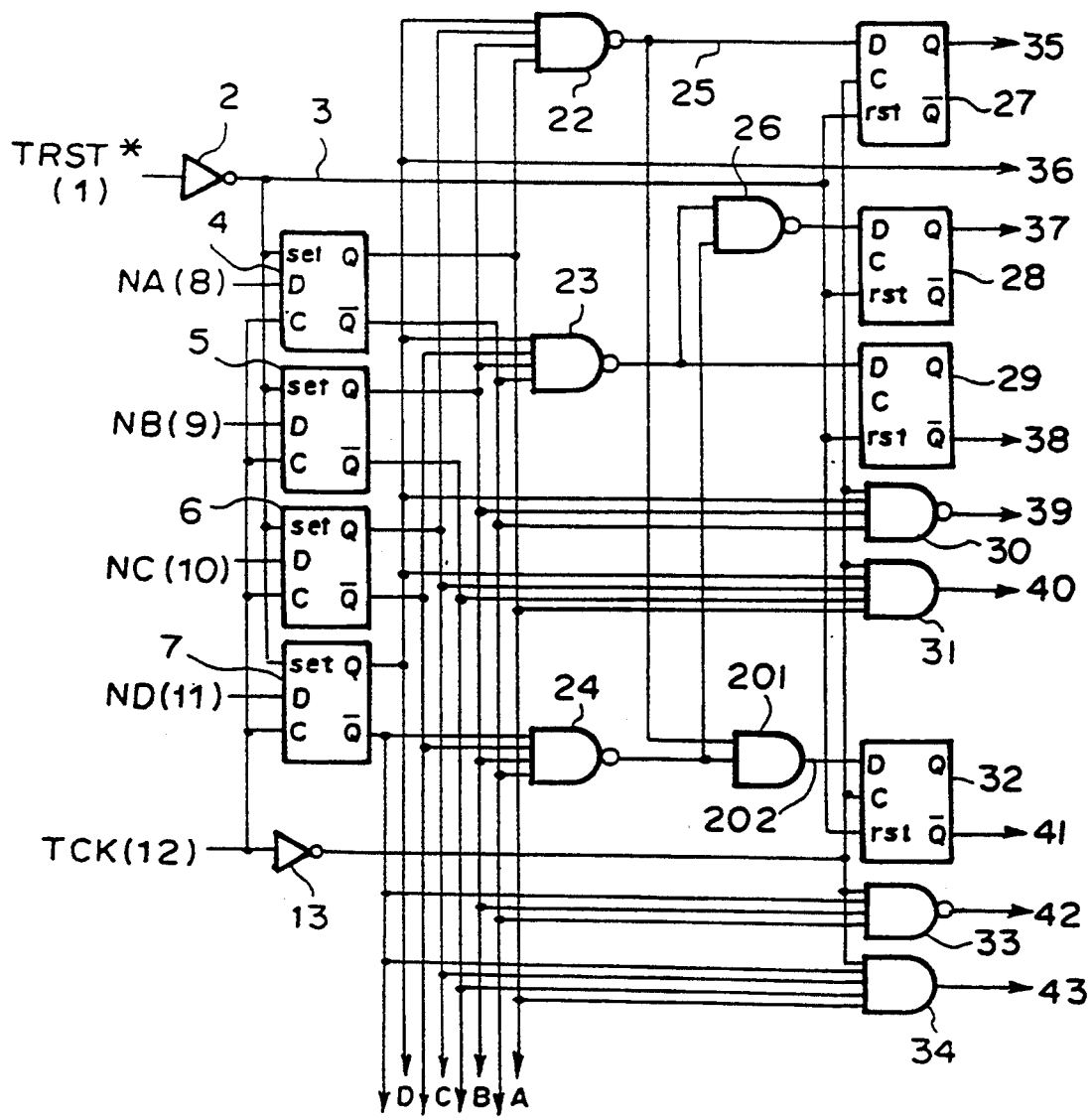
FIG. 8 is a partial circuit diagram of a further TAP controller embodying the present invention.

FIG. 8 is a circuit diagram of part of a further embodiment of the present invention. In this embodiment, the Reset* signal 35 emits the signal 25 entered to DFF 27 at the falling edge of the TCK signal 12. The signal 25 and the output of the NAND gate 24 are entered to the AND gate 201, whose output signal 202 is entered to DFF 32 to emit the ShiftDR signal 41 at the falling edge of the TCK signal 12.

The timing of the circuit of this embodiment when the TAP controller and the boundary scan register cell operate is shown in FIG. 7, as in the same manner as the first embodiment. While the Reset* signal 35 is low, the output of AND gate 201 is "L", and the signal 202 is held low and the Q output of DFF 32 is turned into "H" with the result that ShiftDR signal 41 is held high.

In the first embodiment, although the ShiftDR signal 41 is modified without changing the internal arrangement of the conventional TAP controller 70, the change of Reset* signal 35 is followed by the change of ShiftDR signal 41. While, in the second embodiment, change of ShiftDR 41 can be caused simultaneously with the change of Reset* signal 35 by the falling edge of the TCK signal 12.

What is claimed is:

1. An apparatus for controlling a test access port and a boundary-scan test system based on the U.S. standard IEEE 1149.1 wherein the boundary-scan test system includes a tap controller responsive to a test mode signal and a test clock signal to generate a shift data register signal and a clock data register signal to a boundary scan cell having a multiplexer responsive to said shift data register signal for selecting an input of a boundary scan register, said apparatus comprising:

means responsive to said test mode signal and said test clock signal for emitting said shift data register signal for selecting an input of a boundary scan register, and a gate for selecting said shift data register signal which causes the terminal input of each cell of said boundary scan register to be disabled when said controller is in the Test-Logic-Reset condition, wherein said means for emitting said shift data register signal is a D-type flip-flop, said apparatus further comprising an inverter connected to receive said shift data register signal from said D-type flip-flop, an output of said inverter being connected to a first input of said gate and a second input of said gate being connected to receive a reset signal, whereby said shift data register signal is maintained at a level that prevents a penetrating current from being selected by said multiplexer when said reset signal is not present.

2. An apparatus for controlling a test access port and a boundary-scan test system based on the U.S. standard IEEE 1149.1 wherein the boundary-scan test system includes a tap controller, which allows a test mode selector signal and a test clock to be entered and emits a shift data register signal to a boundary scan cell having a multiplexer responsive to said shift data register signal for selecting the input of a boundary scan register, comprising:

a gate emitting a shift data register signal at a falling edge of a test clock signal, and a D-type flip-flop circuit connected to receive the shift data register signal from said gate for emitting said shift data register signal, causing the terminal input of each cell of said boundary scan register to be disabled when said controller is in the Test-Logic-Reset condition, whereby said shift data register signal is maintained at a level that prevents a penetrating current from being selected by said multiplexer when said reset signal is not present.

* * * * *